United States Patent [19]

Ishihara et al.

[11] Patent Number: 5,350,915
[45] Date of Patent: Sep. 27, 1994

[54] IMAGE SENSOR USING ORGANIC PHOTOCONDUCTOR

[75] Inventors: Kei Ishihara, Yokohama; Kiyoshi Matsuda, Yamato; Atsushi Tamaki, Machida; Masatoshi Katoh, Fujisawa; Tadahiko Hamaguchi, Kamakura; Takashi Takeda, Kamakura, all of Japan

[73] Assignees: Mitsubishi Kasei Corporation; Mitsubishi Electric Corporation, both of Tokyo, Japan

[21] Appl. No.: 77,443

[22] Filed: Jun. 17, 1993

[30] Foreign Application Priority Data

Jun. 18, 1992 [JP] Japan .................. 4-159783

[51] Int. Cl.$^5$ ............................. H01J 40/14
[52] U.S. Cl. .................... 250/208.1; 257/448
[58] Field of Search .............. 250/208.1, 216; 257/448; 358/494

[56] References Cited

U.S. PATENT DOCUMENTS

| 4,560,866 | 12/1985 | Takenouchi et al. | 250/216 |
| 4,570,076 | 2/1986 | Hamano et al. | 250/208 |
| 4,737,852 | 4/1988 | Dohkoshi et al. | |
| 4,754,152 | 6/1988 | Hayama et al. | |
| 4,914,504 | 4/1990 | Rosan | |

FOREIGN PATENT DOCUMENTS

| 0303049 | 2/1989 | European Pat. Off. |
| 0328011 | 8/1989 | European Pat. Off. |
| 61-285262 | 12/1986 | Japan |
| 61-291657 | 12/1986 | Japan |
| 1184961 | 7/1989 | Japan |

OTHER PUBLICATIONS

Patent Abstracts of Japan, vol. 11, No. 179 (E-514), Jun. 9, 1987 & JP-A-62 012 157, Jan. 21, 1987.
Patent Abstracts of Japan, vol. 11, No. 150 (C-422), May 15, 1987 & JP-A-61 285 262, Dec. 16, 1986.
IEEE Transactions on Components, Hybrides and Manufacturing Technology, vol. CHMT-7, No. 4, Dec. 1984, Kouhei Suzuki, et al., "High Speed and High Resolution Contact-Type Image Sensor Using an Amorphous Silicon Photodetector Array", pp. 423–428.

Primary Examiner—David C. Nelms
Assistant Examiner—K. Shami
Attorney, Agent, or Firm—Oblon, Spivak, McClelland, Maier & Neustadt

[57] ABSTRACT

An image sensor uses an image reading element formed by integrating pixels for converting image information to an electric signal. In each of the pixels, a common electrode common to all the pixels and an individual electrode corresponding to each of the pixels are disposed through at least an organic photoconductive layer. A crosstalk capacitance of each of the pixels is equal to or smaller than 35% of a sum of an electric capacitance between individual electrodes and an output capacitance of the individual electrode. A blocking layer may be disposed between the common and individual electrodes. Each of the pixels may be constructed such that the individual electrode is arranged on a supporting body, and a blocking layer and the photoconductive layer are formed on the individual electrode, and the common electrode is arranged on the blocking and photoconductive layers. Otherwise, each of the pixels may be constructed such that the common electrode is arranged on a supporting body, and a blocking layer and the photoconductive layer are formed on the common electrode, and the individual electrode is arranged on the blocking and photoconductive layers.

14 Claims, 10 Drawing Sheets

IMAGE SENSOR USING ORGANIC PHOTOCONDUCTOR

BACKGROUND OF THE INVENTION

1. Field of the Invention

The present invention relates to an image reading element used in an image sensor for converting an image signal to an electric signal and outputting the converted electric signal. More particularly, the present invention relates to a sensor using an organic photoconductive material as a photoelectric converting material.

2. Description of the Related Art

An optical sensor is widely used as a position sensor in measurement of light intensity, a robot and various kinds of automatic systems. The optical sensor is also widely used in reading of image information in information communication, information processing, etc. In particular, since techniques and abilities of image information processing are advanced at present, it is very desirable to develop an image sensor as an input device of image information having high performance. The image input device is typically required in a facsimile telegraph, a word processor, an electronic filing system, etc.

Such an input device is divided into a device for outputting two-dimensional information of a video camera, etc. and an image scanner for scanning and reading an image by using a line sensor. The image scanner using the line sensor is normally used to obtain sufficient resolving power and a sufficient number of pixels. The line sensor is typically constructed by a charge coupled device using crystal silicon. However, there is a limit in size of the charge coupled device. Accordingly, when an image having a large area is read, it is necessary to use an optical system for reduction or arrange many charge coupled devices with high accuracy. In contrast to this, in the case of a sensor having cadmium sulfide and amorphous silicon as a photoconductive face, a size of this sensor can be set to be relatively large and a line sensor of an equal magnification contact type is partially used practically by using a rod lens array.

However, there is a limit in a film forming method with respect to such a general photoconductive material so that mass productivity is low. Accordingly, it is substantially difficult to manufacture a long line sensor for scanning an image having a large area. In contrast to this, in the case of a sensor using an organic material as a photoconductive material, a film can be easily formed by coating of coating liquid. Accordingly, productivity of this sensor is excellent and this sensor is easily large-sized. Further, dark conductivity of this sensor is low and a signal-to-noise ratio can be set to be large. For example, Japanese Patent Application Laying Open (KOKAI) Nos. 61-285262, 61-291657 and 1-184961 show some known examples of an image sensor using an organic material as a photoconductive layer.

However, in such an image sensor using the organic photoconductive material, resolving power is low in comparison with an image sensor using an inorganic photoconductive material so that it is difficult to obtain a preferable output image. In the following description, this resolving power is called MTF for short.

MTF is a value defined by the following formula, $$[(V_{max}-V_{min})/(V_{max}+V_{min})] \times 100 (\%)$$

where $V_{max}$ is a maximum value of an output voltage of the image sensor and $V_{min}$ is a minimum value of this output voltage. MTF can be measured by inputting an original having white and black portions arranged at an equal distance to the image sensor.

When the resolving power (MTF) is practically equal to or greater than 30%, the original can be read with relatively high resolution so that an excellent output image can be obtained.

SUMMARY OF THE INVENTION

It is therefore an object of the present invention to provide an image sensor in which a film can be easily formed and productivity is excellent and the sensor is easily large-sized and dark conductivity is low and a signal-to-noise ratio can be set to be large and an organic photoconductive material is used, and resolving power (MTF) is high.

The above object of the present invention can be achieved by an image sensor using an image reading element formed by integrating pixels for converting image information to an electric signal in which a common electrode common to all the pixels and an individual electrode corresponding to each of the pixels are disposed through at least an organic photoconductive layer; a crosstalk capacitance between the individual electrodes being equal to or smaller than 35% of a sum of an electric capacitance of each of the pixels and an output capacitance of the individual electrode.

In accordance with this structure of the image sensor, a film can be easily formed and productivity is excellent and the image sensor is easily large-sized. Further, dark conductivity is low and a signal-to-noise ratio can be set to be large and an organic photoconductive material can be used, and resolving power (MTF) can be set to be high.

Further objects and advantages of the present invention will be apparent from the following description of the preferred embodiments of the present invention as illustrated in the accompanying drawings.

BRIEF DESCRIPTION OF THE DRAWINGS

FIGS. 2a and 2b are respectively a plan view for explaining one example of the image reading element of a sandwich type and a cross-sectional view of the image reading element taken along line A-A' in FIG. 2a;

DESCRIPTION OF THE PREFERRED EMBODIMENTS

Figure 1:
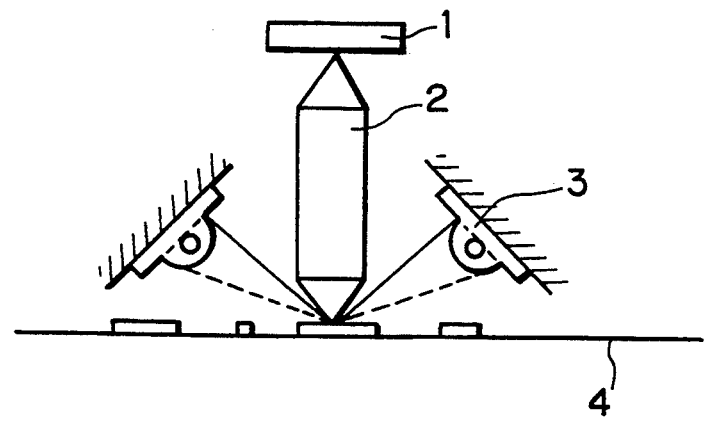
FIG. 1 is a view for explaining the entire construction of an image sensor using an image reading element in the present invention.

The preferred embodiments of an image sensor in the present invention will next be described in detail with reference to the accompanying drawings.

In each of pixels in the present invention, an individual electrode and a common electrode are disposed through an organic photoconductive layer. A method for reading an electric signal of an image sensor using an image reading element formed by integrating such pixels with each other is divided into a method of an electric charge storing type for storing an electric charge to a capacitor and reading the stored charge, and a method of a photoelectric current type for reading a photoelectric current. The former method is preferable with respect to sensitivity and an electric capacitance of each of the pixels is used as the capacitor in many cases without separately disposing any special capacitor.

The electric capacitance of each of the pixels is a capacitance between the individual and common electrodes. In this case, the electric charge is stored as a sum of the electric capacitance of each of the pixels and an output capacitance of the individual electrode.

The output capacitance of the individual electrode is an electric capacitance between the individual electrode and a reference potential. The reference potential normally means zero volt. When an electric capacitance between the individual electrode and another adjacent individual electrode is represented as a crosstalk capacitance, a degree of interference between outputs of the pixels is represented by a ratio 1/k of the crosstalk capacitance to a sum of the electric capacitance of each of the pixels and the output capacitance of the individual electrode.

An image sensor having resolving power (MTF) equal to or greater than 30% can be obtained by setting the degree of interference between the pixel outputs to be equal to or smaller than a specific value.

Namely, the resolving power (MTF) of an output of the image sensor relates to a ratio k of a sum of the electric capacitance of each of the pixels and the output capacitance of the individual electrode to the crosstalk capacitance. Concretely, the resolving power (MTF) is increased as the ratio k is increased. An influence of ratio k on the resolving power (MTF) is increased as a spatial frequency f is increased.

Accordingly, to obtain the image sensor having resolving power (MTF) equal to or greater than 30%, it is sufficient to set the crosstalk capacitance to be equal to or smaller than 35% of a sum of the electric capacitance of each of the pixels and the output capacitance of the individual electrode. The crosstalk capacitance is preferably set to be equal to or smaller than 30% of this sum.

However, when an organic photoconductive film layer is formed by coating of coating liquid in a sensor using an organic material, it is difficult to set a film thickness to be equal to or thinner than 1 μm in view of an accuracy in formation of the film layer. Further, a dielectric constant of the organic photoconductive layer is a small value equal to or smaller than 3.5. Accordingly, the electric capacitance of each of the pixels is ranged from 0.1 to 1 picofarad (pF) so that this electric capacitance is small in comparison with a sensor using an inorganic material. As a result, it is difficult to set the ratio of the crosstalk capacitance to a sum of the electric capacitance of each of the pixels and the output capacitance of the individual electrode to be equal to or smaller than 35%.

The inventors in this patent application considered means for reducing the crosstalk capacitance and means for increasing the electric capacitance of each of the pixels or the output capacitance of the individual electrode, and found the following structures as these means. Namely, it is preferable to design and form the individual electrode in a specific shape so as to reduce the crosstalk capacitance. It is preferable to dispose an insulation layer in at least a portion of the individual and common electrodes so as to increase the electric capacitance of each of the pixels. And it is preferable to dispose an insulation layer between the individual electrode and a third electrode except for the individual or common electrode holding a constant electric potential so as to increase the output capacitance of the individual electrode.

The present invention will next be described in detail with reference to the accompanying drawings.

FIG. 1 shows one example of the entire construction of a sensor using an image reading element in the present invention. This example is an example of a so-called line sensor of a contact type. Light from a light source composed of an LED array 3 is irradiated and reflected on an original face 4. This light is irradiated by a rod lens array 2 to a photoconductive portion 1 of the line sensor and is photoelectrically converted to an electric signal by each of pixels. This electric signal is sequentially read as a time series signal through a switching element connected to an individual electrode. The electric signal is read as an electric charge storing type with respect to an electric current caused by the photoelectric conversion in each of the pixels. Each of the pixels is composed of a photoconductive layer and an electrode pair and is one-dimensionally arranged and is used as a line sensor.

Figure 2A:
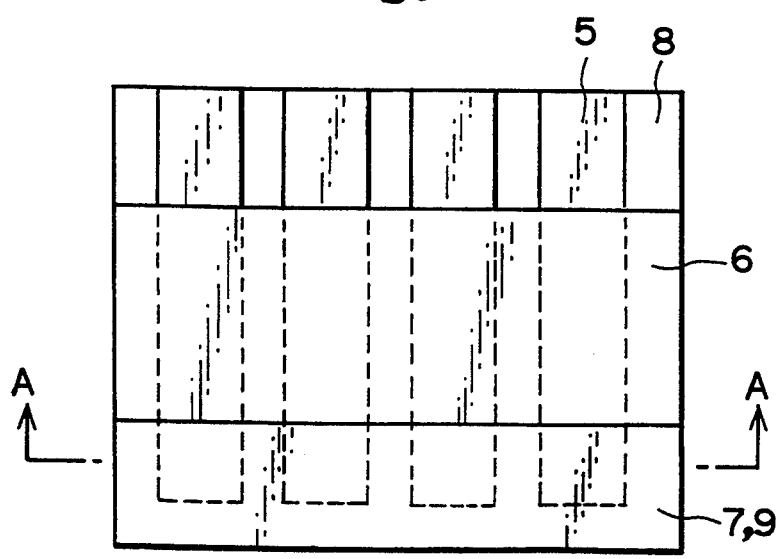
Figure 2B:
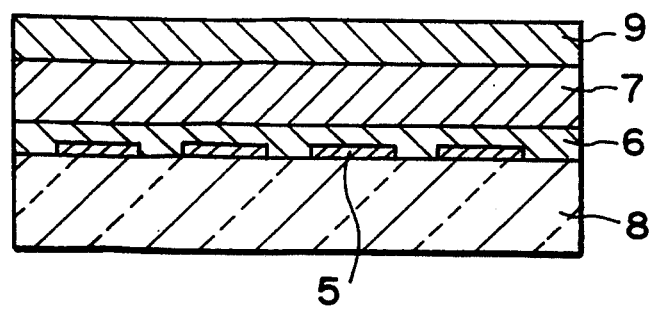

FIGS. 2a and 2b show an example of the construction of a so-called sandwich type element in the image reading element of the sensor. In this case, a blocking layer 6 and a photoconductive layer 7 are formed on a supporting body 8 having an individual electrode 5 thereon. A common electrode g is disposed on the photoconductive layer 7. The blocking layer 6 comes indirect contact with the individual electrode 5. One of electrodes constituting the electrode pair is constructed by the individual electrode. One pixel is constructed by the electrode pair composed of one individual electrode and an electrode opposite to this one individual electrode, and photoconductive and blocking layers arranged between electrode pairs so that a signal corresponding to light about a separate pixel can be outputted. The photoconductive layer, the block layer and one the electrode pair may be commonly constructed with respect to each of pixels. It is necessary to set at least one of the electrodes to a transparent electrode for sufficiently transmitting light therethrough as an incident passage of light. The transparent electrode is formed by a metallic oxide such as indium oxide, tin oxide and an oxide film of indium and tin, or a metallic thin film of gold, aluminum, etc. The opposite electrode can be constructed by using various kinds of metals. For example, the opposite electrode is made of aluminum, titanium, gold, silver, copper, nickel, chromium, molybdenum, tantalum, tungsten, etc. When an exposure operation is performed from the side of a supporting body, it is necessary to sufficiently transmit light through the supporting body. An organic photoconductive layer is constructed by diffusing a charge generating substance such as azo pigment, phthalocyanine pigment, polycyclic quinone pigment, perylene pigment, merocyanine pigment, squarylium pigment, etc. into a binder. The organic photoconductive layer may include the charge generating substance and a charge moving substance as effective components and may be formed by diffusing both the substances to binder resin. The organic photoconductive layer may be also constructed by laminating the charge generating layer and the charge moving layer.

The blocking layer is formed to prevent an ohmic contact between the organic photoconductive layer and a positive electrode. The ohmic contact has no rectification characteristics with respect to the positive electrode. The blocking layer is formed to prevent an increase in dark current and a reduction in S/N ratio. A material of the blocking layer is constructed by copolymerization nylon resin of 6-66-12, 6-66-11, 6-66-610, etc. , alkoxyalkyl nylon, polyurethane, phenol resin, casein, polyvinyl acetal, hardened epoxy resin, silicon oxide, titanium oxide, aluminum oxide, silicon carbide, etc.

The width of a portion of the individual electrode opposed to the common electrode is set to be increased as much as possible to increase an output of each of the pixels. Accordingly, a distance between individual electrodes is reduced and crosstalk capacitance is increased so that resolving power (MTF) is reduced. Therefore, it is preferable to prevent the reduction in resolving power (MTF) by designing a shape of the individual electrode such that the crosstalk capacitance is reduced. Concretely, the width of a portion of the individual electrode unopposed to the common electrode is narrowed in comparison with the width of the individual electrode portion opposed to the common electrode. Otherwise, a length of the individual electrode is reduced. In accordance with such a method, it is possible to reduce the crosstalk capacitance.

Figure 3:
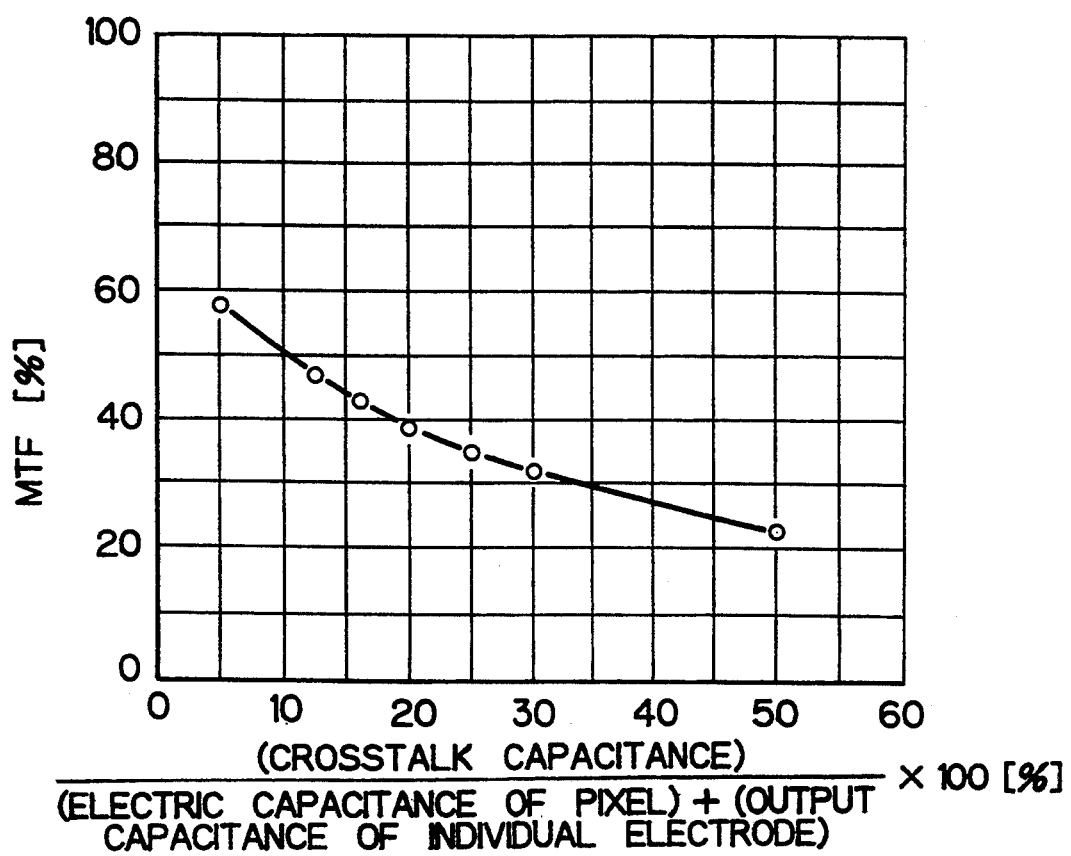
FIG. 3 is a graph showing a change in resolving power (MTF) when the ratio of a crosstalk capacitance to a sum of the electric capacitance of a pixel and the output capacitance of an individual electrode is changed.

In an image sensor constructed by 8 pixels per 1 mm (8 dot/mm) , the crosstalk capacitance is changed by changing the width of the individual electrode portion unopposed to the common electrode. FIG. 3 shows measured results of the resolving power (MTF) by using this image sensor when an original having four sets of white and black line pairs per 1 mm (4 lp/mm, showing 4 line pairs per 1 mm) is concretely read. In this case, tile length of the individual electrode is set to 1 cm. A rod lens array is a general lens array, and its resolving power (MTF) is 70% when 4 lp/mm is set. 4 lp/mm shows a highest spatial frequency for enabling a reading operation of the image sensor of 8 dot/min. The resolving power (MTF) is reduced as the spatial frequency is increased. Accordingly, the resolving power (MTF) in FIG. 3 shows a minimum value thereof in an output of the image sensor. From the measured results of FIG. 3, it is possible to obtain a resolving power (MTF) value (equal to or greater than 30%) required to perform a binary operation of the sensor output when a shape of the individual electrode is designed such that the crosstalk capacitance is equal to or smaller than 35% of a sum of the electric capacitance of each of the pixels and the output capacitance of the individual electrode and is preferably equal to or smaller than 30% of this sum.

When the width of an individual electrode is narrowed, a problem about an increase in resistance value of the individual electrode, etc. are caused. However, there is almost no influence of an increase in resistance of an electrode portion on an output signal of each of the pixels even when the width of an individual electrode portion unopposed to the common electrode is set to be half the width of an individual electrode portion opposed to the common electrode. Further, the crosstalk capacitance can be sufficiently set to be small by using this shape of the individual electrode.

When the increasement of the electric capacitance of each of the pixels is aimed, a constructional portion of the organic photoconductive layer 7 and the blocking layer and a construction portion of an insulation layer 10 and the blocking layer 8 are arranged between the common electrode 9 and the individual electrode 5 as shown in FIG. 4 or 5. In accordance with such an element structure, it is possible to increase the electric capacitance of each of the pixels by an electric capacitance the insulation layer.

However, when the insulation layer is arranged between the common and individual electrodes, the electric capacitance of each of the pixels is irregularly provided when the shape of an end portion of the organic photoconductive layer 7 is irregularly formed in a boundary portion of the organic photoconductive layer 7 and the insulation layer 10. Therefore, no uniform output of the image sensor can be obtained in this case.

Figure 4A:
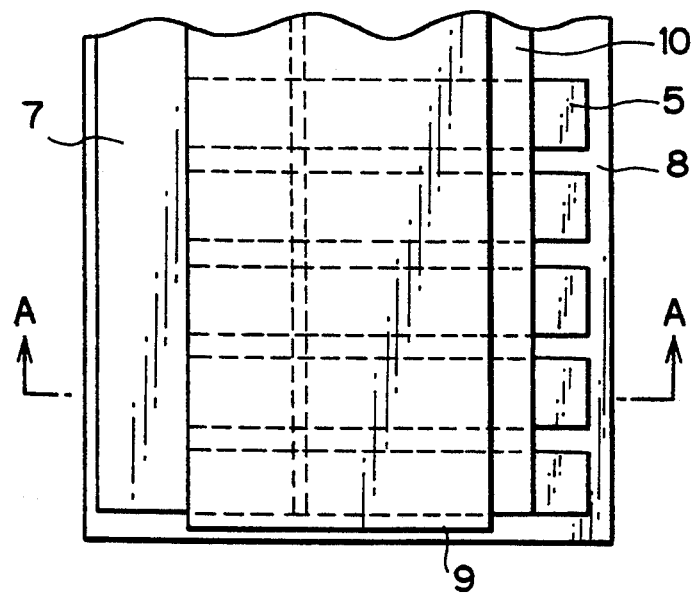
FIGS. 4a and 4b are views for explaining an element structure in which an insulation layer is arranged between the individual electrode and a common electrode.
Figure 4B:
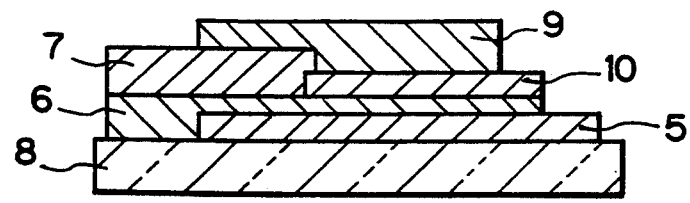
Figure 5A:
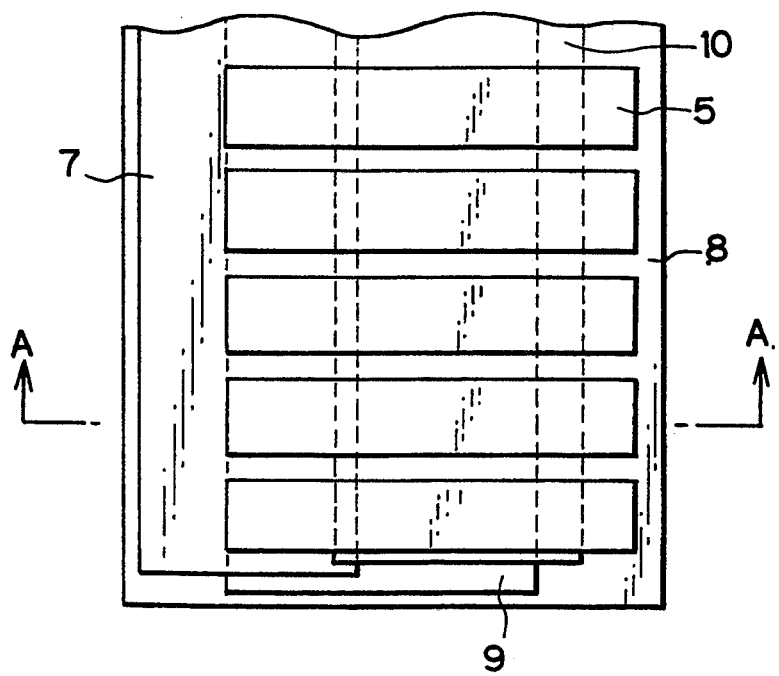
FIGS. 5a and 5b are views for explaining an element structure in which an insulation layer is arranged between the individual electrode and a common electrode.
Figure 5B:
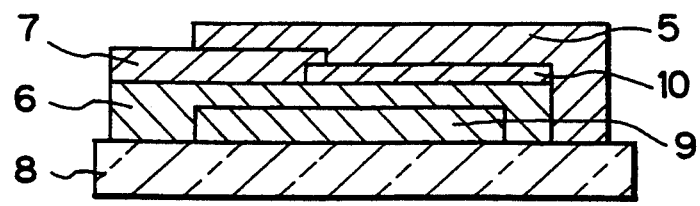
Figure 8A:
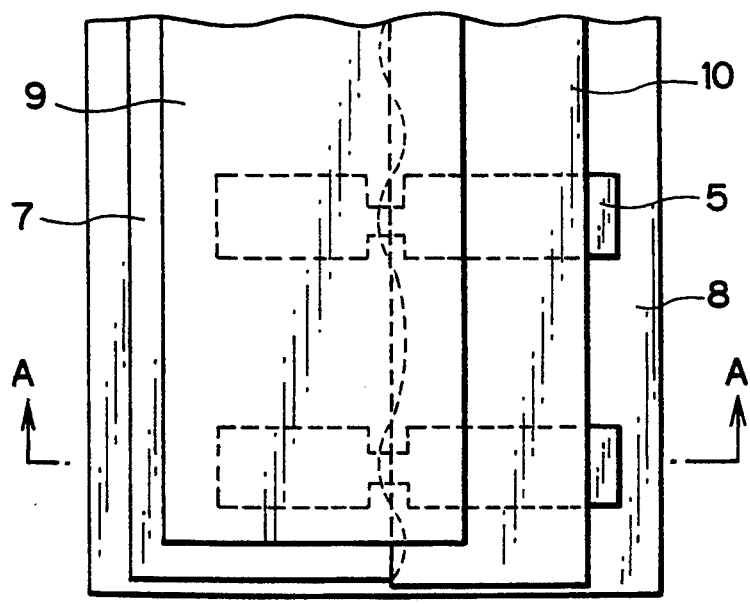
FIGS. 8a and 8b are views for explaining a width of the individual electrode narrowed in an end portion of an organic photoconductive layer.
Figure 8B:
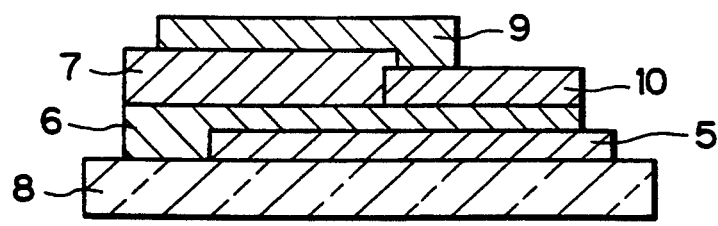

Accordingly, in the case of an element structure using the insulation layer, a line width of the individual electrode is narrowed as shown in FIGS. 8a and 8b in the boundary portion of the organic photoconductive layer and the insulation layer. Thus, it is possible to prevent uniformity of the electric capacitance of each of the pixels from being lost even when the shape of the end portion of the organic photoconductive layer is irregularly formed, thereby improving uniformity of the output of the image sensor. In FIGS. 8a and 8b, the element structure in FIGS. 4a and 4b is shown, but similar effects can be obtained even when the element structure shown in FIGS. 5a and 5b is used.

Figure 6A:
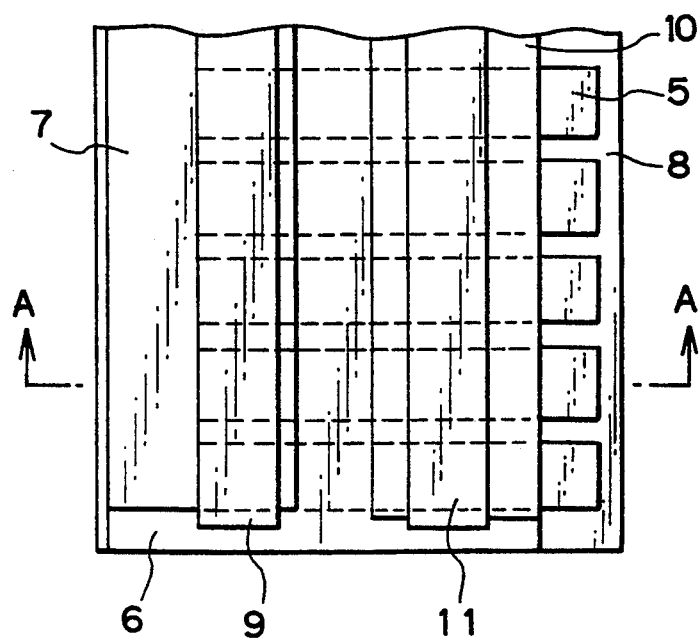
FIGS. 6a and 6b are views for explaining an element structure in which an insulation layer is arranged between the individual electrode and a third electrode holding a constant electric potential.
Figure 6B:
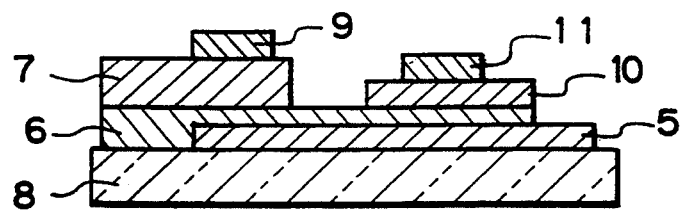
Figure 7A:
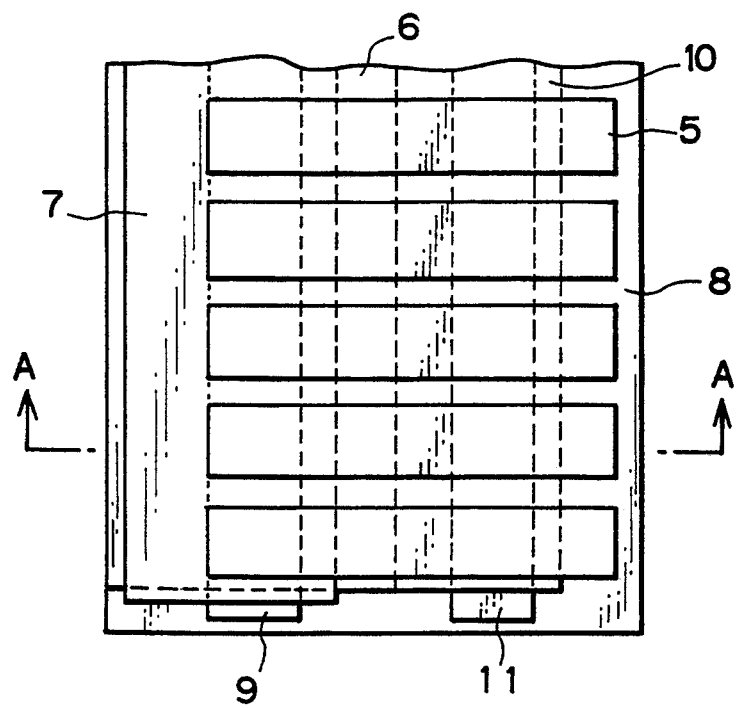
FIGS. 7a and 7b are views for explaining an element structure in which an insulation layer is arranged between the individual electrode and a third electrode holding a constant electric potential.
Figure 7B:
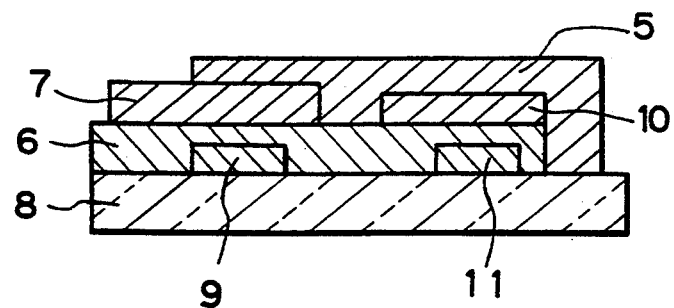

It is preferable to arrange an insulation layer 10 between the individual electrode 5 and a third electrode 11 holding a constant potential so as to increase the output capacitance of the individual electrode (see FIG. 6 or 7) . In this case, the output capacitance of the individual electrode can be increased by an electric capacitance of the insulation layer. In this element structure, a blocking layer functions as the insulation layer even When no insulation layer is especially disposed, thereby providing the same effects.

A material of the insulation layer in the present invention is constructed by diffusing an inorganic substance such as copolymerization nylon resin of 6-66-12, 6-66-11, 6-66-610, etc. , alkoxyalkyl nylon, polyurethane, polyimide, vinyl acetate, polyester, acrylic resin, phenol resin, casein, polyvinyl acetal, hardened epoxy resin, silicon oxide, polystyrene, vinyl chloride, polyethylene, silica, etc. into a binder. A volumetric specific resistance value of the diffused substance is set to be equal to or greater than $10^7$ Ω cm.

In the image sensor obtained by the present invention, the photoconductive layer can be easily formed and productivity is high. Further, the image sensor is easily large-sized and has low dark conductivity. Further, a signal/noise ratio of the image sensor can be set to be large and resolving power (MTF) is high. Accordingly, the image sensor of the present invention has many practical advantages.

Concrete Embodiments of the present invention will next be described in detail, but the present invention is not limited to these Embodiments within the features and scope thereof.

Embodiment 1

Figure 9:
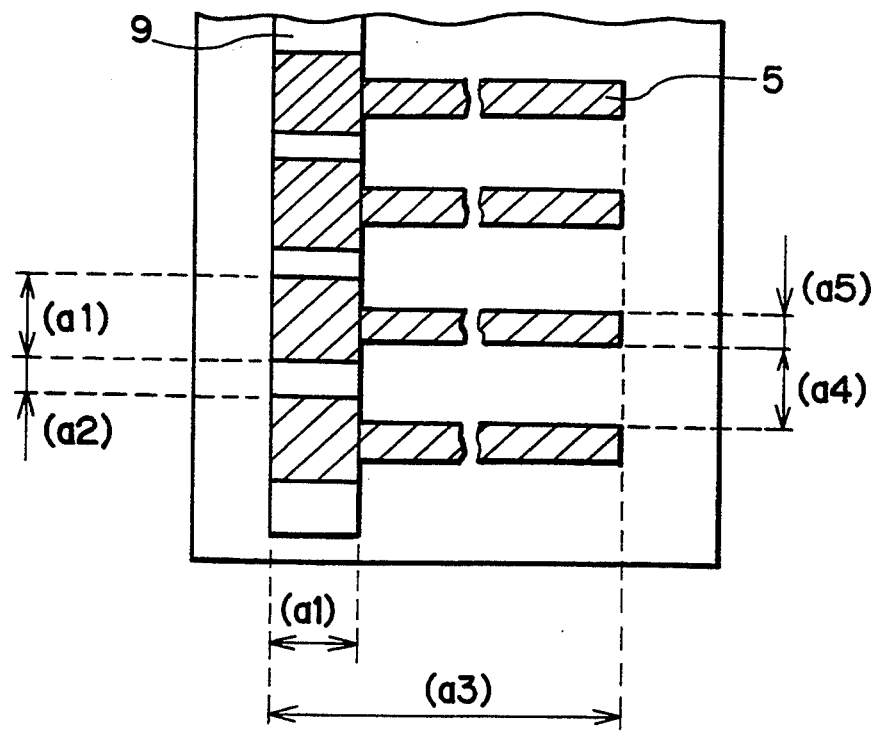
FIG. 9 is a view for explaining a size of the individual electrode.

Copolymerization nylon manufactured by DAICEL CHEMICAL INDUSTRIES, Ltd. as trade name DAIAMID T171 was dissolved to n-propanol. A total of 1728 elements composed of 8 elements per 1 mm were one-dimensionally patterned on a glass plate with a transparent electrode of indium tin oxide (ITO) as an individual electrode. The glass plate was then dried and was dipped and coated with a film having a thickness of 0.3 μm. A shape of the individual electrode was formed as shown in FIG. 9 to reduce crosstalk capacitance. In FIG. 9, sizes a1 to a5 were respectively set to 100 μm, 25 μm, 1 cm, 75 μm and 50 μm.

Diffusive processing of oxytitanium-phthalocyanine of 10 grams as a charge generating substance was performed by a sand grinder by using dimethoxyethane. The processed oxytitanium-phthalocyanine was mixed with liquid obtained by dissolving polyvinyl butyral resin of 5 grams manufactured by SEKISUI CHEMICAL Co., Ltd. as trade name S-LEC BH-3 to dimethoxyethane, thereby obtaining a coating liquid. A blocking layer composed of the above copolymerization nylon was coated with this coating liquid by a dipping method and was then dried so that a charge generating layer having a thickness of 0.4 μm was formed. Next, polycarbonate of 100 grams manufactured by MITSUBISHI KASEI Corp. as trade name NOVAREX 7025A, a chemical compound of 160 grams represented by the following chemical formula (1), and a chemical compound of 40 grams represented by the following chemical formula (2) were dissolved into dioxane.

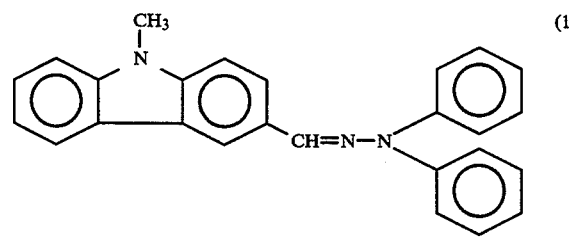

(1)

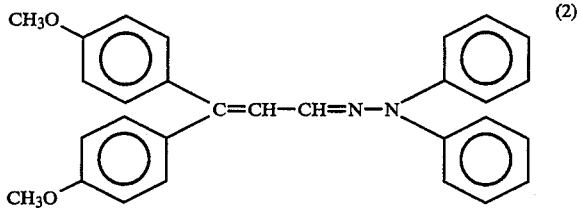

(2)

The above charge generating layer was dipped and coated with this dissolved compound and was dried so that a charge moving layer having a thickness of 0.5 μm was formed. Further, aluminum was evaporated in vacuum on this charge moving layer so that an opposite electrode was formed. Thus, a sandwich type element shown in FIGS. 2a and 2b was formed. The sandwich type element was connected to a fundamental circuit of a charge storing type constructed by an analog switch, an amplifying circuit and a comparator so that a light receiving portion was formed. As a result, a crosstalk capacitance was 0.3 pF and an electric capacitance of each of pixels was 0.3 pF and an output capacitance of each of individual electrodes was 1.3 pF. This crosstalk capacitance value was calculated from an electrode pattern. The electric capacitance value of each of the pixels was calculated from dielectric constants and thicknesses of the blocking layer, the charge generating layer and the charge moving layer and an area for each of the pixels. The value of the output capacitance of the individual electrode was obtained by measuring and using an input capacitance of the analog switch.

Further, a rod lens array and an LED illuminating system were attached to the light receiving portion so that a line image sensor was manufactured. The rod lens array was constructed by using a lens array manufactured by NIPPON SHEET GLASS Co., Ltd. as trade name SLA-20. Optical resolving power (MTF) of this line image sensor was equal to 70% when an original of 4 lp/mm was inputted. The LED array was constructed by using an LED array manufactured by STANLEY DENKI Co., Ltd. as trade name BU4801 and having an output peak wavelength of 570 nm. An illuminating system of this LED array was manufactured such that illuminance on an original face was equal to 100 lux. A switching frequency was set to 250 kHz and a line scanning time as a repeating time was set to 20 msec. When the original of 4 lp/mm was read by using this image sensor, a preferable value 50% of the resolving power (MTF) can be obtained.

Embodiment 2

Figure 10:
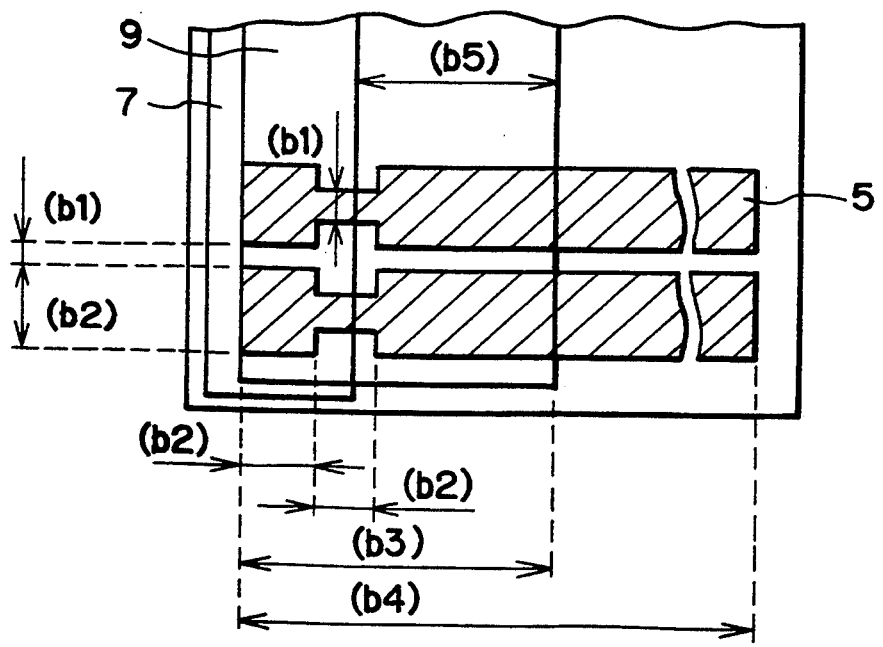
FIG. 10 is a view for explaining a size of the individual electrode.

The element structure shown in FIGS. 4a and 4b was used in this Embodiment 2. A manufacturing method of the other constructional element portions was similar to that in the Embodiment 1. The sizes of individual and common electrodes were shown in FIG. 10. Sizes b1 to b5 in FIG. 10 were respectively set to 25 μm, 100 μm, 400 μm, 1 cm and 250 μm. A blocking layer was used as an insulation layer without disposing any special insulation layer.

As a result, a crosstalk capacitance was 0.4 pF and an electric capacitance of each of pixels was 1.2 pF and an output capacitance of each of individual electrodes was 1.3 pF. A method for getting these capacitance values was similar to that in the Embodiment 1. When an original of 4 lp/mm was read by using this image sensor, a preferable value 45% of resolving power (MTF) could be obtained.

Output values of elements changed within a range of ±5% so that there was no problem about the uniformity of an output of the image sensor.

Embodiment 3

The element structure shown in FIGS. 5a and 5b was used in this Embodiment 3. A manufacturing method of the other constructional element portions was similar to that in the Embodiment 1. The sizes of individual and common electrodes were shown in FIG. 10. Sizes b1 to b5 in FIG. 10 were respectively set to 25 μm, 100 μm, 400 μm, 1 cm and 250 μm. A blocking layer was used as an insulation layer without disposing any special insulation layer.

As a result, a crosstalk capacitance was 0.4 pF and an electric capacitance of each of pixels was 1.2 pF and an output capacitance of each of individual electrodes was 1.3 pF. A method for getting these capacitance values was similar to that in the Embodiment 1. When an original of 4 lp/mm was read by using this image sensor, a preferable value 45% of resolving power (MTF) could be obtained.

Output values of elements changed within a range of ±5% so that there was no problem about the uniformity of an output of the image sensor.

Embodiment 4

Figure 11:
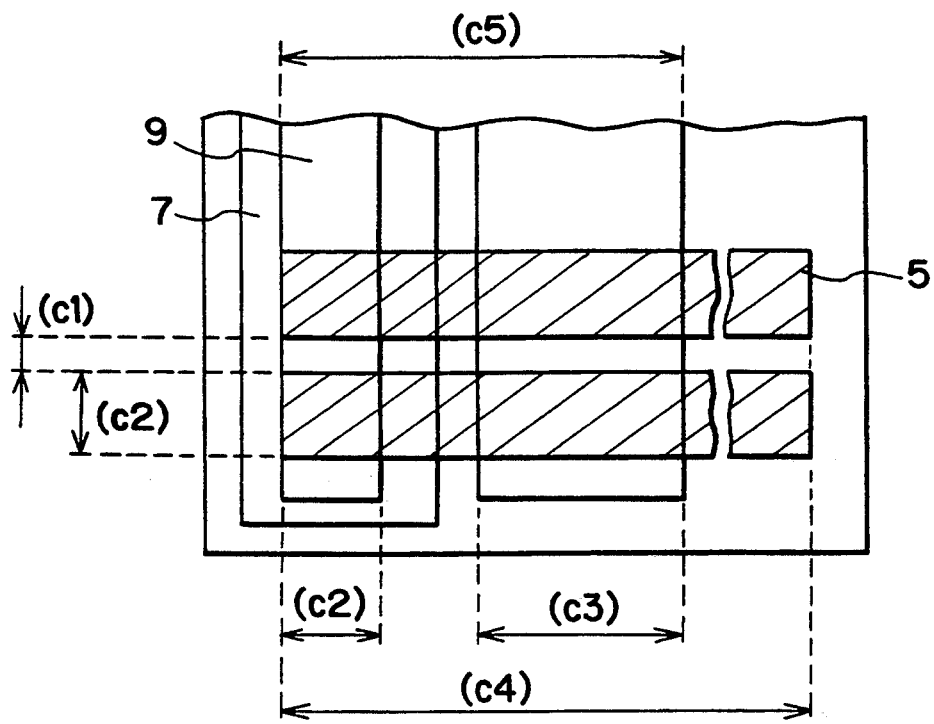
FIG. 11 is a view for explaining a size of the individual electrode.

The element structure shown in FIGS. 6a and 6b was used in this Embodiment 4. A manufacturing method of the other constructional element portions was similar to that in the Embodiment 1. The sizes of individual and common electrodes were shown in FIG. 11. A third electrode 11 was held to be zero volt. Sizes c1 to c5 in FIG. 11 were respectively set to 25 μm, 100 μm, 300 μm, 1 cm and 500 μm. A blocking layer was used as an insulation layer without disposing any special insulation layer.

As a result, a crosstalk capacitance was 0.4 pF and an electric capacitance of each of pixels was 0.3 pF and an output capacitance of each of individual electrodes was 2.2 pF. A method for getting the crosstalk capacitance value and the electric capacitance value was similar to that in the Embodiment 1. The output capacitance of an individual electrode was obtained by calculating the value of an electric capacitance of the third electrode from a dielectric constant and a thickness of a blocking layer and an electrode pattern, and adding this calculated capacitance value to the input capacitance of an analog switch, When an original of 4 lp/mm was read by using this image sensor, a preferable value 45% of resolving power (MTF) could be obtained.

Output values of elements changed within a range of ±5% so that there was no problem about the uniformity of an output of the image sensor.

Embodiment 5

Figure 13:
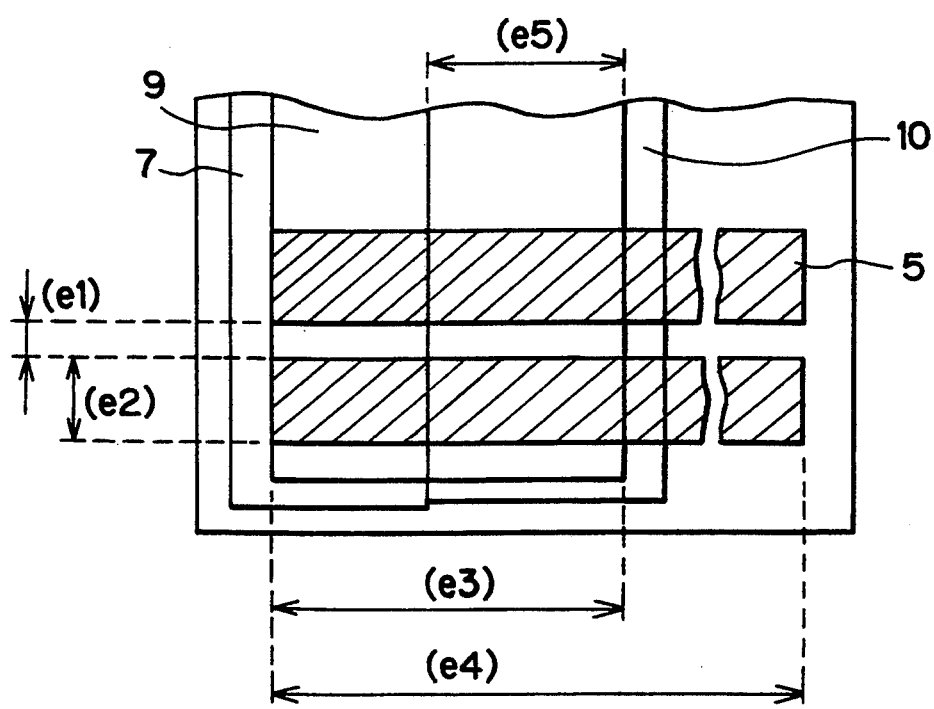
FIG. 13 is a view for explaining a size of the individual electrode.

The planar shape of an individual electrode was formed as shown in FIG. 13. A manufacturing method of the other constructional element portions was similar to that in the Embodiment 2. Sizes e1 to e5 in FIG. 13 were respectively set to 25 μm, 100 μm, 400 μm, 1 cm and 250 μm. A crosstalk capacitance was 0.4 pF and an electric capacitance of each of pixels was 1.2 pF and an output capacitance of each of individual electrodes was 1.3 pF. A method for getting these capacitance values was similar to that in the Embodiment 1.

Output values of elements changed within a range of ±30%. When an original of 4 lp/mm was read by using this image sensor, a preferable value 50% of resolving power (MTF) could be obtained.

Comparing Example 1

Figure 12:
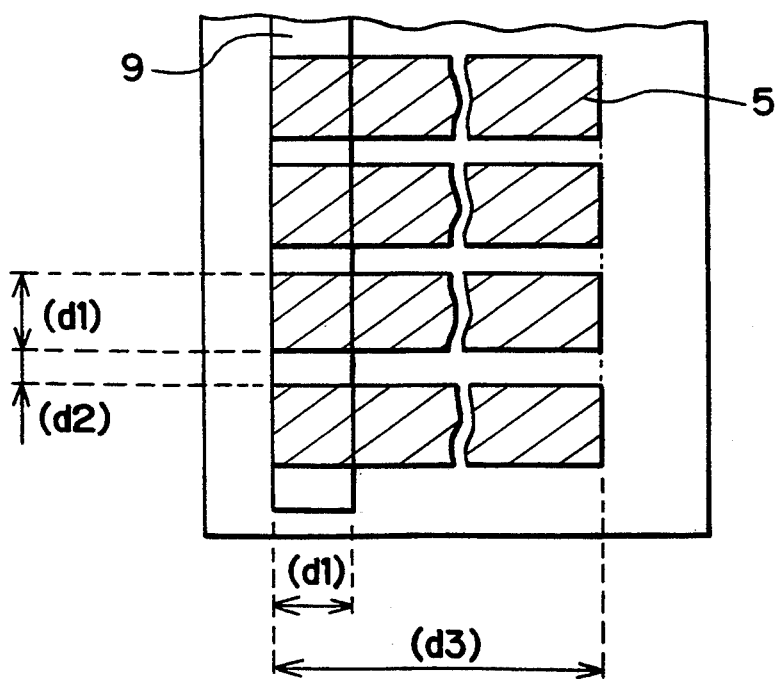
FIG. 12 is a view for explaining a size of the individual electrode.

The planar shape of an individual electrode was formed as shown in FIG. 12. A manufacturing method of the other constructional element portions was similar to that in the Embodiment 1. Similar to the Embodiment 1, resolving power (MTF) was measured. Sizes d1 to d3 in FIG. 12 were respectively set to 100 μm, 25 μm and 1 cm. As a result, a crosstalk capacitance was 0.8 pF and an electric capacitance of each of pixels was 0.3 pF and an output capacitance of each of individual electrodes was 1.3 pF. A method for getting these capacitance values was similar to that in the Embodiment 1.

When an original of 4 lp/mm was read by using this image sensor, the value of resolving power (MTF) was 25% so that resolution was reduced in comparison with the Embodiment 1.

Many widely different embodiments of the present invention may be constructed without departing from the spirit and scope of the present invention. It should be understood that the present invention is not limited to the specific embodiments described in the specification, except as defined in the appended claims.

What is claimed is:

1. An image sensor using an image reading element formed by integrating pixels for converting image information to an electric signal in which a common electrode common to all the pixels and an individual electrode corresponding to each of the pixels are disposed through at least an organic photoconductive layer;
   a crosstalk capacitance between the individual electrodes being equal to or smaller than 35% of a sum of an electric capacitance of each of the pixels and an output capacitance of the individual electrode.

2. An image sensor as claimed in claim 1, wherein a blocking layer is further disposed between the common and individual electrodes.

3. An image sensor as claimed in claim 1, wherein each of the pixels is constructed such that the individual electrode is arranged on a supporting body, and a blocking layer and the photoconductive layer are formed on the individual electrode, and the common electrode is arranged on the blocking and photoconductive layers.

4. An image sensor as claimed in claim 1, wherein each of the pixels is constructed such that the common electrode is arranged on a supporting body, and a blocking layer and the photoconductive layer are formed on the common electrode, and the individual electrode is arranged on the blocking and photoconductive layers.

5. An image sensor as claimed in claim 1, wherein at least one of the common and individual electrodes is constructed by a transparent electrode.

6. An image sensor as claimed in claim 3 or 4, wherein the supporting body is constructed by a transparent supporting body.

7. An image sensor as claimed in claim 1, wherein the individual electrode is formed such that the width of an individual electrode portion unopposed to said common electrode is narrower than the width of an individual electrode portion opposed to the common electrode.

8. An image sensor as claimed in claim 1, wherein an insulation layer is disposed in at least a portion between the common and individual electrodes.

9. An image sensor as claimed in claim 1, wherein a constructional portion of the organic photoconductive layer and a blocking layer and a constructional portion of an insulation layer and the blocking layer are arranged between the common and individual electrodes.

10. An image sensor as claimed in claim 9, wherein a line width of the individual electrode is set to be narrow in a boundary portion of the organic photoconductive layer and the insulation layer.

11. An image sensor as claimed in claim 1, wherein a third electrode holding a constant potential is arranged such that the third electrode is opposed to a portion of the individual electrode through at least a blocking layer.

12. An image sensor as claimed in claim 10, wherein an insulation layer is arranged in at least a portion between the third electrode and the individual electrode.

13. An image sensor as claimed in claim 8, 9, 10 or 12, wherein the insulation layer is formed by an insulator having a volumetric specific resistance value equal to or greater than $10^7 \, \Omega$ cm.

14. An image sensor as claimed in claim 1, wherein the crosstalk capacitance is equal to or smaller than 30% of the sum of the electric capacitance of each of the pixels and the output capacitance of the individual electrode.

* * * * *